United States Patent
Flourens et al.

(10) Patent No.: US 8,023,416 B2
(45) Date of Patent: Sep. 20, 2011

(54) MODULE FOR TESTING ELECTROMAGNETIC COMPATIBILITY OF A HIGH-SPEED ETHERNET INTERFACE ONBOARD AN AIRCRAFT

(75) Inventors: Franck Flourens, Toulouse (FR); Eddie Gambardella, Blagnac (FR); Patrick Heins, Castelnau de Montmiral (FR); Bernard Boisson, Brax (FR); Philippe Sant-Anna, Lasserre (FR); Joseph Rival, Villemur sur Tarn (FR)

(73) Assignee: Airbus Operations SAS, Toulouse (FR)

( * ) Notice: Subject to any disclaimer, the term of this patent is extended or adjusted under 35 U.S.C. 154(b) by 875 days.

(21) Appl. No.: 11/915,758

(22) PCT Filed: Jun. 7, 2006

(86) PCT No.: PCT/FR2006/050532
§ 371 (c)(1),
(2), (4) Date: Nov. 28, 2007

(87) PCT Pub. No.: WO2006/131678
PCT Pub. Date: Dec. 14, 2006

(65) Prior Publication Data
US 2008/0197859 A1 Aug. 21, 2008

(30) Foreign Application Priority Data
Jun. 9, 2005 (FR) .................................. 05 51550

(51) Int. Cl.
*G01R 31/08* (2006.01)
*G01R 27/28* (2006.01)
*H04J 1/16* (2006.01)
*H04L 1/00* (2006.01)

(52) U.S. Cl. .......................................... 370/241; 324/612
(58) Field of Classification Search .................. 370/241; 324/612; 439/627, 676; 375/224
See application file for complete search history.

(56) References Cited

U.S. PATENT DOCUMENTS

| | | | | |
|---|---|---|---|---|
| 3,883,715 A | * | 5/1975 | Gebo | 219/210 |
| 5,864,658 A | * | 1/1999 | Theobald | 714/25 |
| 6,064,694 A | * | 5/2000 | Clark et al. | 375/224 |
| 6,121,779 A | * | 9/2000 | Schutten et al. | 324/627 |
| 6,332,166 B1 | | 12/2001 | Cranford et al. | |
| 6,434,716 B1 | * | 8/2002 | Johnson et al. | 714/712 |
| 6,452,938 B1 | * | 9/2002 | Fawal et al. | 370/463 |

(Continued)

FOREIGN PATENT DOCUMENTS

EP 0 513 992 11/1992

(Continued)

OTHER PUBLICATIONS

Stephens, William E., et al., "155.52 MB/S Data Transmission on Category 5 Cable Plant", Computers and Communications, IEEE, pp. 168 to 178, 1995.

*Primary Examiner* — Ayaz Sheikh
*Assistant Examiner* — Hoang-Chuong Vu
(74) *Attorney, Agent, or Firm* — Oblon, Spivak, McClelland, Maier & Neustadt, L.L.P.

(57) ABSTRACT

A module to test electromagnetic compatibility of at least one high speed Ethernet interface onboard an aircraft. The module includes a cable less than 1 meter long, the ends of which are fitted with two aircraft contacts, two standard connectors compatible with standard test equipment, and a mechanism simulating attenuation of a test cable.

11 Claims, 3 Drawing Sheets

U.S. PATENT DOCUMENTS

| | | | |
|---|---|---|---|
| 7,075,893 B1 * | 7/2006 | Mlinarsky et al. | 370/241 |
| 7,649,855 B1 * | 1/2010 | Lo et al. | 370/278 |
| 2002/0105912 A1 * | 8/2002 | Krishnamachari et al. | 370/241 |
| 2003/0204611 A1 | 10/2003 | McCosh et al. | |
| 2005/0036451 A1 * | 2/2005 | Green | 370/242 |
| 2005/0213693 A1 * | 9/2005 | Page | 375/354 |
| 2006/0044713 A1 * | 3/2006 | Buchwald et al. | 361/43 |
| 2006/0245697 A1 * | 11/2006 | Toillon et al. | 385/88 |
| 2008/0049458 A1 * | 2/2008 | Pozzuoli et al. | 363/21.12 |

FOREIGN PATENT DOCUMENTS

| | | |
|---|---|---|
| JP | 2003 264469 | 9/2003 |

\* cited by examiner

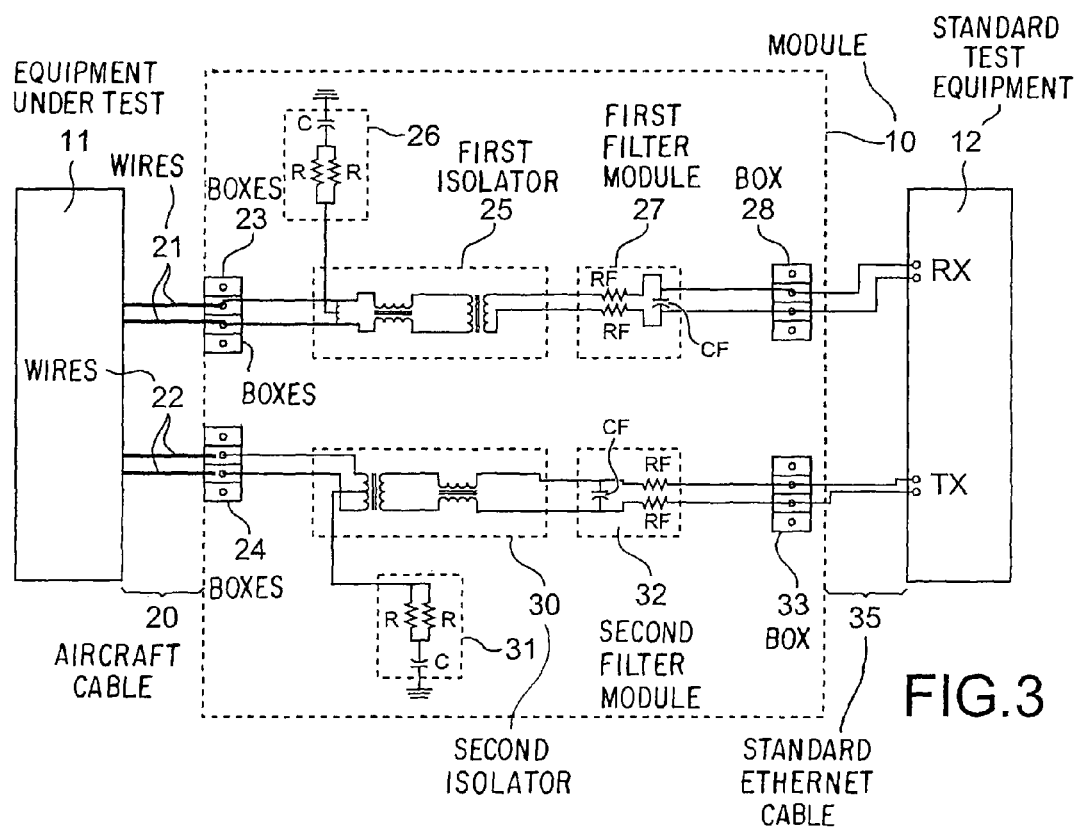
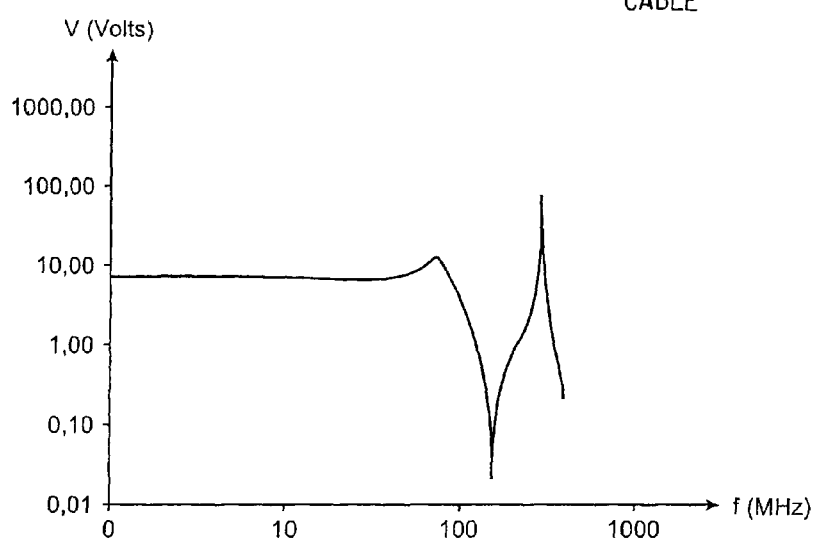
FIG.4

MODULE FOR TESTING ELECTROMAGNETIC COMPATIBILITY OF A HIGH-SPEED ETHERNET INTERFACE ONBOARD AN AIRCRAFT

TECHNICAL DOMAIN

The invention relates to an electromagnetic compatibility test module for a high speed Ethernet interface onboard an aircraft.

STATE OF PRIOR ART

Certification of an Ethernet network onboard an aircraft requires a demonstration of the electromagnetic behaviour of the equipment involved.

The increase in the frequencies used, for example 100 Mbit/s for an AFDX (<<Avionics Full Duplex Switched Ethernet>>) network makes the problem particularly crucial in the avionics field. Considering the frequencies involved (10 kHz-400 MHz), one test that is difficult to perform is the Radio Frequency Conducted Susceptibility.

One test method according to prior art, entitled <<Bulk Current Injection>> or BCI, is described in the document reference [1] at the end of the description. In this method, a test installation similar to an aircraft installation with a cable length of 3.3 meters is used. A current injection simulating an electromagnetic aggression is made using a magnetic torus associated with a cable. As shown on the curve in FIG. 1, in this type of configuration the cable starts resonance in the useful signal band (less than 65 MHz), which leads to <<overtest>> zones (very high voltage peaks more than about 100 volts) and <<undertest>> zones (very small voltage dips of about 60 millivolts).

With a 4-meter long cable, frequencies between 20 and 40 MHz are largely undertested. Therefore, such an embodiment is only acceptable for buses for which operating frequencies are below 20 MHz.

However, if this cable length is limited to 50 cm, the first resonances are pushed to higher frequencies (beyond 80 MHz). However, the signal attenuation that plays an essential role in the signal robustness, is not taken into account for a cable with a length of this order.

The use of such a test cable also creates a problem with the sensitivity to the test installation used; the results obtained are very sensitive particularly to the cable length used and the manner in which the cable is installed, which prevents reliable and reproducible implementation.

The purpose of the invention is to solve such problems using a module for testing the electromagnetic compatibility of a high speed Ethernet interface onboard an aircraft so as to:
  guarantee that signal attenuation is taken into account,
  prevent undertesting of the interface due to resonance that occurs on the cable used at the time of the test.

PRESENTATION OF THE INVENTION

The invention relates to a module to test the electromagnetic compatibility of at least one high speed Ethernet interface onboard an aircraft, characterised in that it comprises:
  a cable less than 1 meter long, for example about 50 cm long, the ends of which are fitted with aircraft contacts,
  two standard connectors compatible with standard test equipment, and
  means of simulating attenuation of a test cable.

Advantageously, the cable ends are fitted with two female <<quadrax>> type contacts. The two connectors are RJ45 type connectors.

Advantageously, the module according to the invention is made in a flat box directly placed on a ground plane with adhesive copper, with a braided connection screwed onto this ground plane.

Advantageously, the means of simulating attenuation comprise at least one insulator connected to a filter module.

In one advantageous embodiment, the module according to the invention comprises an aircraft cable that can be connected to equipment under test, that includes one pair of wires to transmit, and one pair of wires to receive, and a first isolator on the transmission channel connected to a first filter module, and a second isolator on the reception channel connected to a second filter module.

Advantageously, the test module according to the invention is easy to install, easy to use and can give reproducible results despite the high frequencies involved.

BRIEF DESCRIPTION OF THE FIGURES

FIG. 3 shows an example embodiment of the test module according to the invention.

FIG. 4 shows a curve in logarithmic coordinates representing a signal (in volts) as a function of the frequency (in MHz) illustrating operation of the module according to the invention.

DETAILED PRESENTATION OF PARTICULAR EMBODIMENTS

Figure 1:
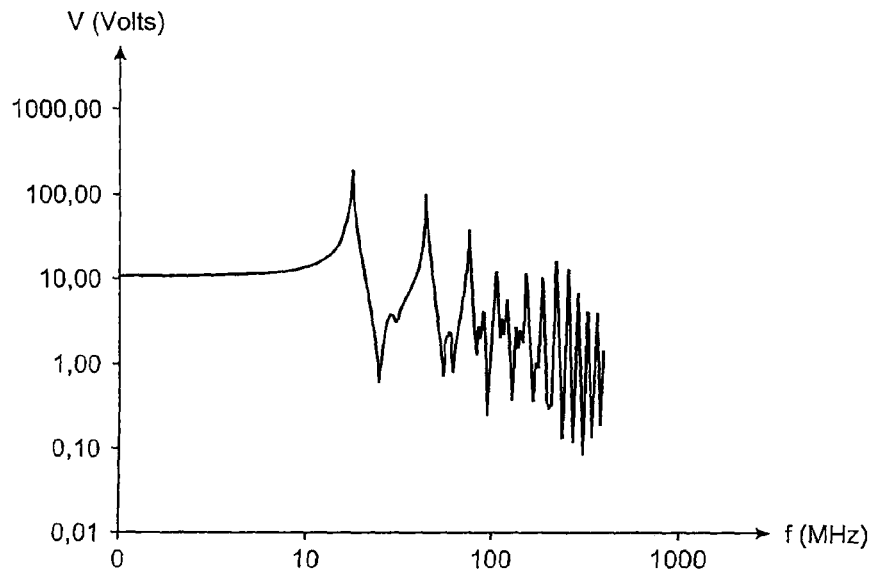
FIG. 1 shows a curve in logarithmic coordinates representing a transmitted signal (in volts) as a function of the frequency (in MHz), illustrating the operation of a test module according to known art.
Figure 2:
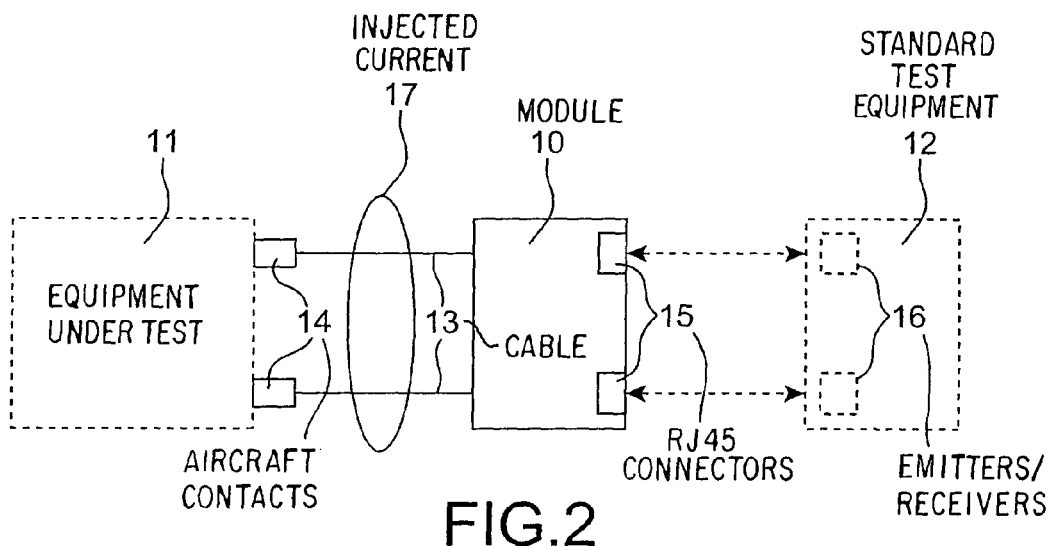
FIG. 2 shows the module for testing electromagnetic compatibility according to the invention, in a first test configuration.

As shown in FIG. 2, the module for testing the electromagnetic compatibility of a high speed Ethernet interface onboard an aircraft according to the invention comprises:
  firstly a cable 13 shorter than the test cables according to prior art, for example less than 1 meter long to prevent any attenuation, the ends of which are fitted with two aircraft contacts 14,
  secondly, two standard connectors compatible with standard test equipment 12, and
  means of simulating the attenuation of a test cable.

This module forms the interface between the <<aircraft world>> (at the left on the figure) and the <<test world>> (at the right on the figure). It enables isolation between these two worlds.

This module 10 is thus connected firstly to equipment under test 11 that is an aircraft computer to be tested, for example the flight controls computer, and secondly to the test equipment 12 that may for example be the equipment as described in document reference [2] (Ethernet test equipment) and [3] (service for performing a test called the <<Bit error rate>>).

Thus, this module comprises the following to test an AFDX interface:
  at one end a cable 13, for example about 50 cm long, the ends of which are fitted with two female <<quadrax>> type contacts (aircraft contacts) 14 while AFDX (<<End System>>) equipment to be tested 11 is fitted with male contacts, at the other end, two RJ45 connectors 15 (PC <<Personal Computer>> type interface) connected to emitters-receivers 16 of the test equipment 12, so as to be compatible with off-the-shelf test equipment, and an electric board that simulates the attenuation of a test cable.

According to the BCI test method, current 17 is injected on the two cable channels 13.

The test equipment 12 can thus send messages (Frames) numbered 1, 2 . . . n to the test equipment under test 11. The equipment under test 11 can then return these messages. The test equipment 12 can then verify that the sent messages and the received messages are identical. If the messages are not identical and a message is corrupted, there must be a problem on the line and the test is not acceptable.

The equipment under test 11 may be provided with a high speed Ethernet interface. But the test module according to the invention can also simultaneously test two high speed Ethernet interfaces using its two channels.

FIG. 3 shows an example embodiment of the test module according to the invention 10 to attenuate the signal and for electromagnetic protection of the interfaces of the test equipment 12.

This figure shows a single test channel with an aircraft cable 20 that can be connected to the equipment under test 11 that comprises a pair of wires 21 for emission (Tx), and a pair of wires 22 for reception (Rx), connected to two boxes 23 and 24.

A first isolator 25 on the transmission channel associated with a set 26 of two resistances R (in parallel to support a high current) and a capacitor C, is connected to a first filter module 27 composed of two filter resistances RF and a filter capacitor CF, itself connected to a box 28.

Similarly, a second isolator 30 on the reception channel associated with a set 31 of two resistances R in parallel and a capacitor C, is connected to a second filter module 32 connected to a box 33.

The test equipment 12 is connected to the boxes 28 and 33 through the shortest possible standard Ethernet cable 35.

Adjustment of the RF and CF components provides the means for adjusting the required attenuation value as a function of the aircraft length.

With such a module, the signal shown in FIG. 4 can be obtained, in which the first resonances (overtest zones and undertest zones) are pushed beyond 80 MHz.

The level of the test performed on aircraft equipment is much higher than 75 mA in the 10 kHz-400 MHz band as defined in chapter 20.4 in reference document [1].

Figure 5:
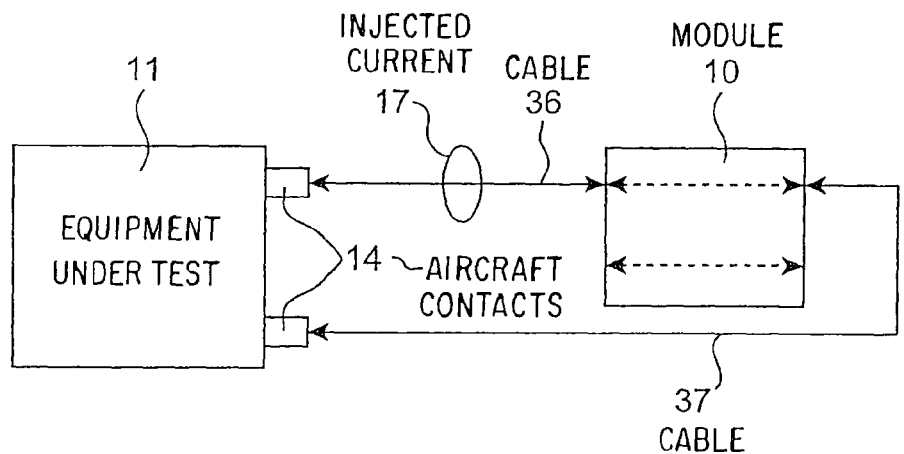
FIGS. 5 and 6 show two test configurations using the module according to the invention.

The test module according to the invention may be used in three different test configurations.

in a first configuration shown in FIG. 2, current is injected on the cable 13.

in a second configuration shown in FIG. 5, the test module 10 according to the invention is looped back to the equipment under test 11 by means of a cable 37 that connects an output from this module to an input to the equipment 11. Current 17 is injected on the cable 36.

Figure 6:
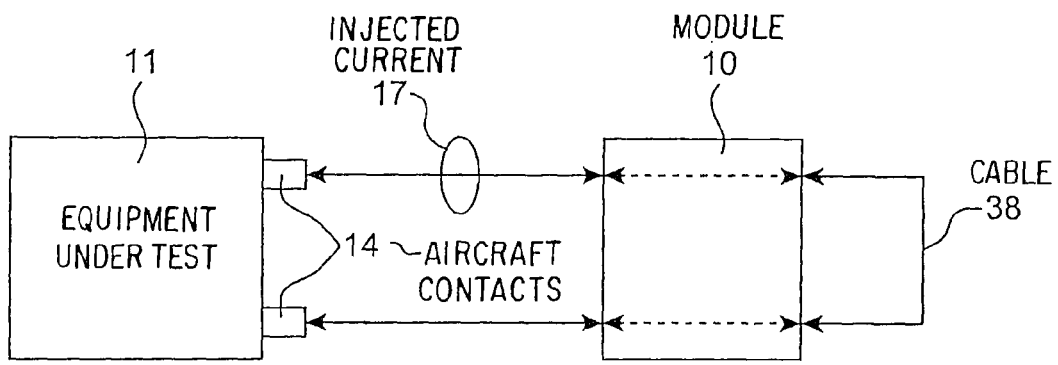

In a third configuration shown in FIG. 6, the test module according to the invention 10 has its two ends connected together with the shortest possible connecting cable 38 between the two contacts 15.

In one AFDX example embodiment, the test module according to the invention has the following characteristics:

It can be used to test two items of equipment under test 11 at the same time (4 AFDX ports) in the first test configuration.

The cable 13 used at the end of the equipment under test is an approximately 50 cm long cable, the ends of which are adapted with female <<quadrax>> type contacts 14.

The connection at the test equipment end is made using RJ45 type connectors 15.

This module is encapsulated in a robust and conducting box allowing for a good connection of this module. This box provides two connections to the ground plane classified in order of preference to guarantee an optimum connection:

a flat box placed directly on the ground plane with adhesive copper, a braided connection to be screwed onto the ground plane.

REFERENCES

[1] International standardisation document RTCA/DO-160 (Chapter 20, <<Radiofrequency Susceptibility>> pages 20-1 to 20-25, 29 Jul. 1997)

[2] http://www.spirentcom.com/analysis/product product.cfm?PL=33&PS=46&PR=378 (Spirent Communications, <<Smartbits Metro Ethernet>>)

[3] http://www.spirentcom.com/analysis/technology.cfm?wt=2&az-c=ss&SS=42 (Spirent Communication, BERT or <<Bit Error Rate Testing>>)

The invention claimed is:

1. A device to test electromagnetic compatibility of at least one high speed Ethernet interface in at least one equipment under test onboard an aircraft, the device comprising:
    a module including a first end and a second end;
    a test cable less than 1 meter long, the test cable including two first ends and two second ends, the first ends of the test cable are connected to the first end of the module, the second ends of the test cable are fitted with two aircraft contacts connected to the at least one equipment under test including the Ethernet interface;
    two standard connectors situated at the second end of the module compatible with two emitters/receivers of a standard test equipment;
    a current injection device to inject current that simulates an electromagnetic aggression as part of the electromagnetic compatibility test; and
    means for simulating attenuation of the test cable by adjusting a resonance of the test cable as a function of a length of the aircraft, said resonance being greater than 80 MHz.

2. A device according to claim 1, in which the test cable is 50 cm long.

3. A device according to claim 1, in which the second ends of the test cable are fitted with two female quadrax type contacts.

4. A device according to claim 1, in which the two standard connectors are RJ45 type connectors.

5. A device according to claim 1, made in a flat box directly placed on a ground plane with adhesive copper, with a braided connection onto the ground plane.

6. A device according to claim 1, in which the means for simulating attenuation comprises at least one insulator connected to a filter module.

7. A device according to claim 6, wherein the test cable includes one pair of wires to transmit, one pair of wires to receive, a first isolator on the transmission channel connected to a first filter module, and a second isolator on the reception channel connected to a second filter module.

8. A device according to claim 1, wherein:
the current injection device includes a magnetic torus to inject current into only a part or all of the test cable to simulate the electromagnetic aggression; and
the standard test equipment is configured to send and receive messages to determine if the at least one equipment under test operates correctly during the current injection.

9. A device to test electromagnetic compatibility of at least one high speed Ethernet interface in at least one equipment under test onboard an aircraft, the device comprising:
a module including a first end and a second end;
a test cable less than 1 meter long, the test cable including two first ends and two second ends, the first ends of the test cable are connected to the first end of the module, the second ends of the test cable are fitted with two aircraft contacts connected to the at least one equipment under test including the Ethernet interface;
two standard connectors situated at the second end of the module compatible with two emitters/receivers of a standard test equipment;
a current injection device to inject current that simulates an electromagnetic aggression as part of the electromagnetic compatibility test; and
an electric board to simulate attenuation of the test cable and including a filter that adjusts a resonance of the test cable as a function of a length of the aircraft, said resonance being greater than 80 MHz.

10. A device according to claim 9, wherein the test cable includes one pair of wires to transmit, one pair of wires to receive, a first isolator on the transmission channel connected to a first filter module, and a second isolator on the reception channel connected to a second filter module.

11. A device according to claim 9, wherein:
the current injection device includes a magnetic torus to inject current into only a part or all of the test cable to simulate the electromagnetic aggression; and
the standard test equipment is configured to send and receive messages to determine if the at least one equipment under test operates correctly during the current injection.

* * * * *